United States Patent
Hu et al.

(10) Patent No.: US 7,435,659 B2
(45) Date of Patent: Oct. 14, 2008

(54) METHOD FOR MANUFACTURING A SEMICONDUCTOR DEVICE HAVING AN ALIGNMENT FEATURE FORMED USING AN N-TYPE DOPANT AND A WET OXIDATION PROCESS

(75) Inventors: Binghua Hu, Plano, TX (US); Sameer P. Pendharkar, Allen, TX (US); Bill A. Wofford, Dallas, TX (US); Joseph M. Ramirez, Addison, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/068,117

(22) Filed: Feb. 28, 2005

(65) Prior Publication Data
US 2006/0194401 A1    Aug. 31, 2006

(51) Int. Cl.
*H01L 21/76* (2006.01)
(52) U.S. Cl. .............. 438/401; 438/299; 438/364; 438/369
(58) Field of Classification Search .......... 438/299, 438/364, 369, 400, 401, 362
See application file for complete search history.

(56) References Cited

U.S. PATENT DOCUMENTS

| 4,573,257 | A  | * | 3/1986  | Hulseweh ............... 438/504 |
| 5,252,510 | A  | * | 10/1993 | Lee et al. ............... 438/401 |
| 5,397,734 | A  | * | 3/1995  | Iguchi et al. ........... 438/241 |
| 6,331,456 | B1 | * | 12/2001 | Wu .......................... 438/154 |
| 6,348,371 | B1 | * | 2/2002  | Huang et al. ........... 438/218 |
| 6,803,668 | B2 |   | 10/2004 | Holloway et al. |
| 7,332,405 | B2 | * | 2/2008  | Yabe et al. ............. 438/401 |

* cited by examiner

*Primary Examiner*—Phuc T Dang
*Assistant Examiner*—Thanh Y Tran
(74) *Attorney, Agent, or Firm*—Frederick J. Telecky, Jr.; Wade J. Brady, III

(57) ABSTRACT

The present invention provides a method for manufacturing a semiconductor device having an alignment feature. The method for manufacturing the semiconductor device, among other steps, may include implanting an n-type dopant into a substrate thereby forming an implanted region and an unimplanted region in the substrate. The method may further include oxidizing the substrate using a wet oxidation process, the wet oxidation process and n-type dopant causing a ratio of oxidation of the implanted region to the unimplanted region to be 2:1 or greater, and then removing the oxidized portions of the substrate thereby leaving an alignment feature proximate the implanted region.

15 Claims, 6 Drawing Sheets

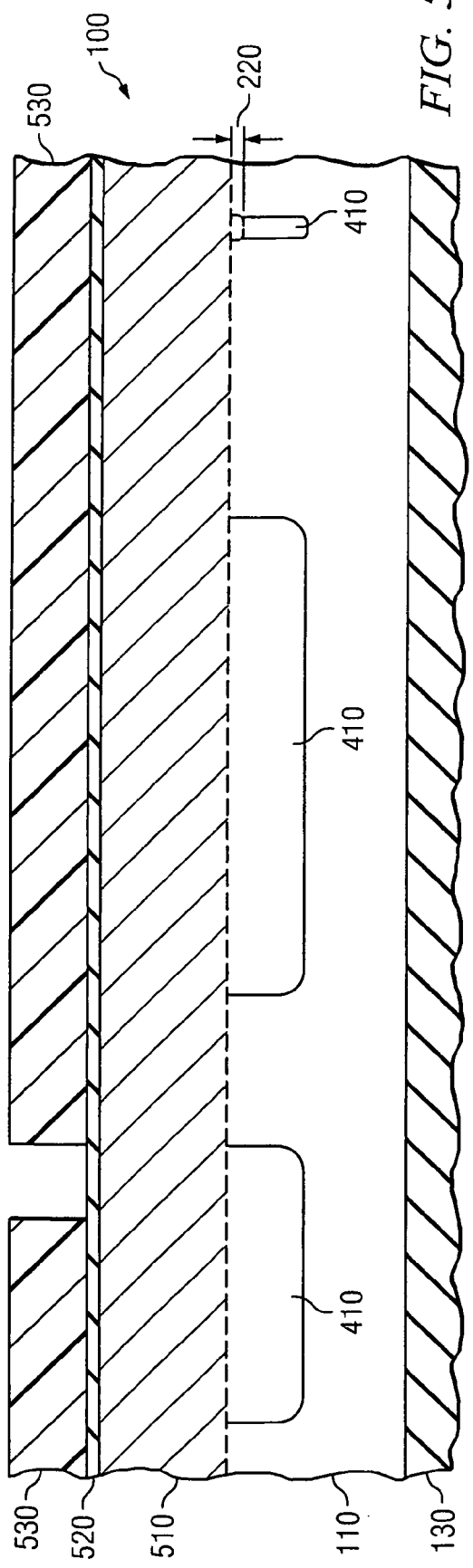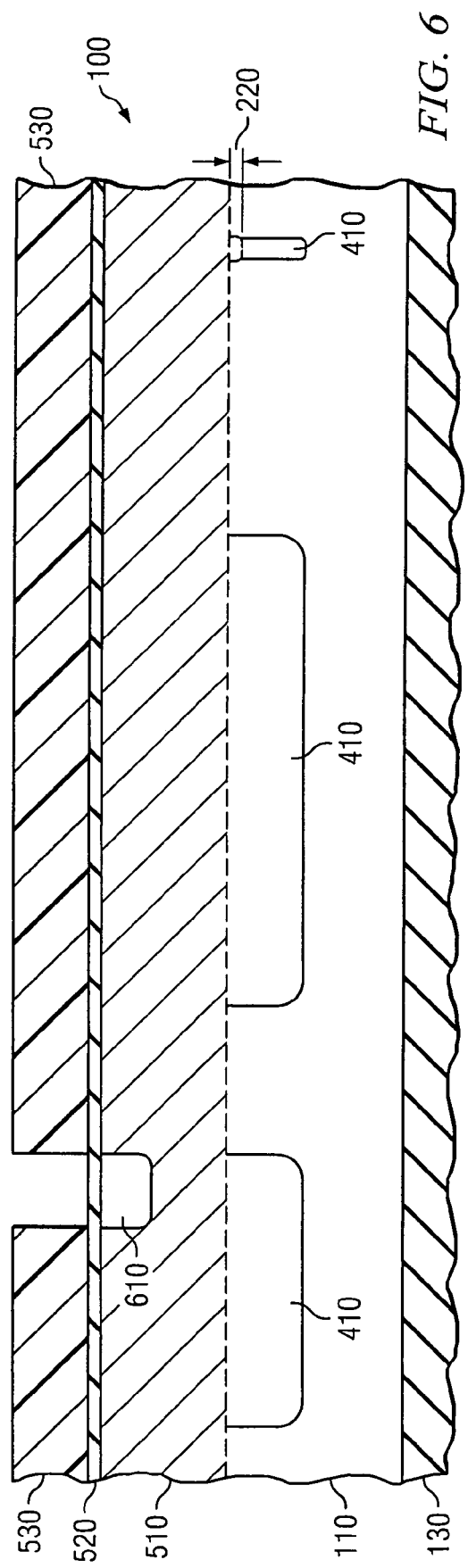

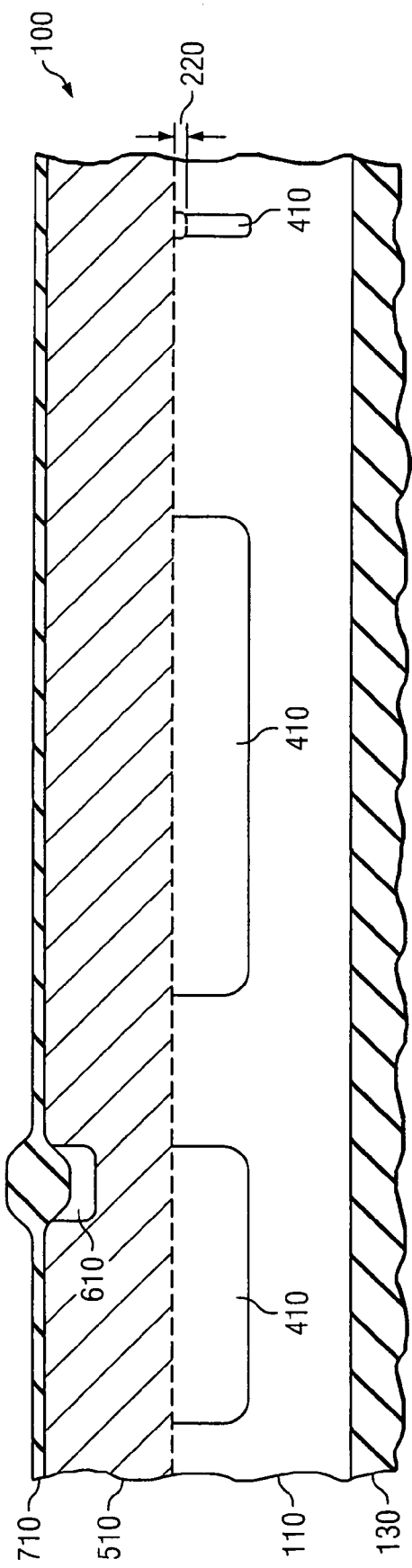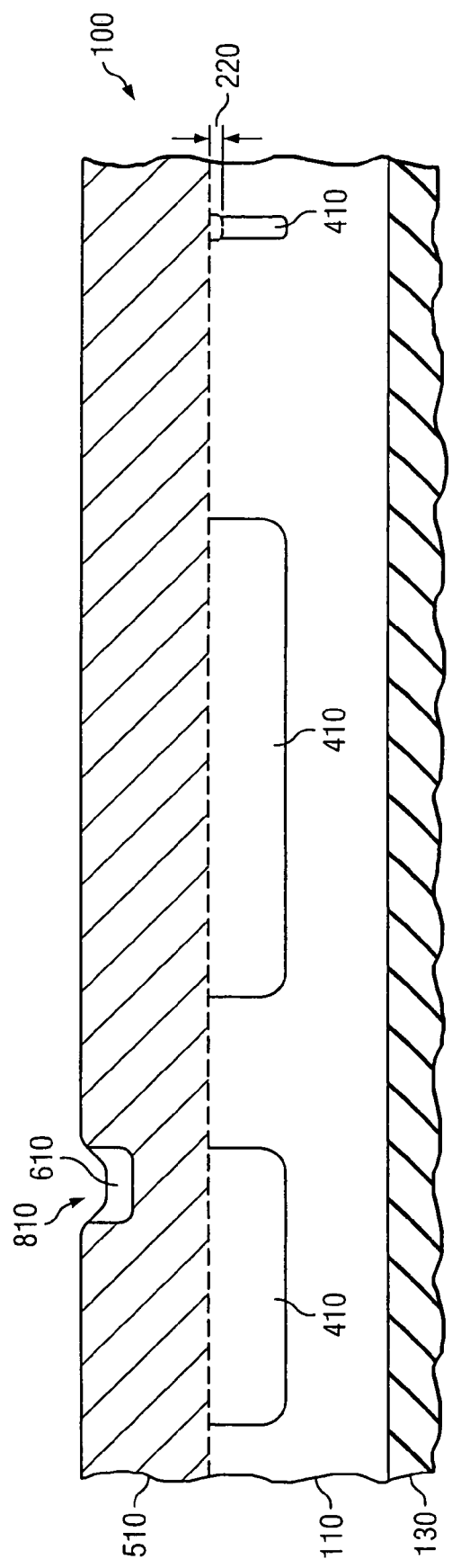

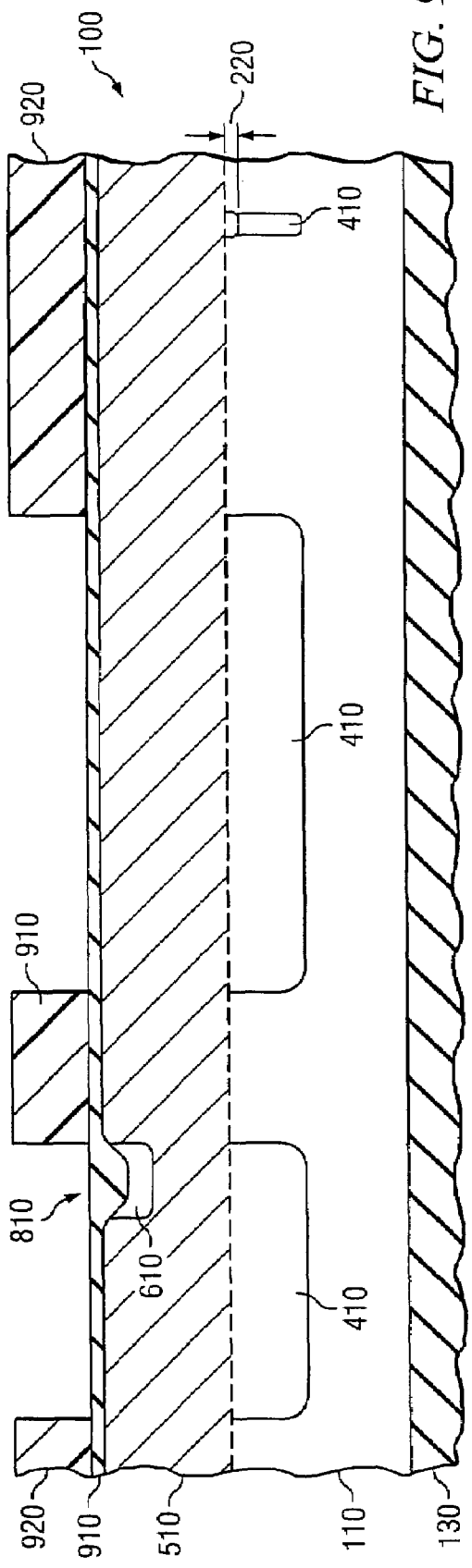
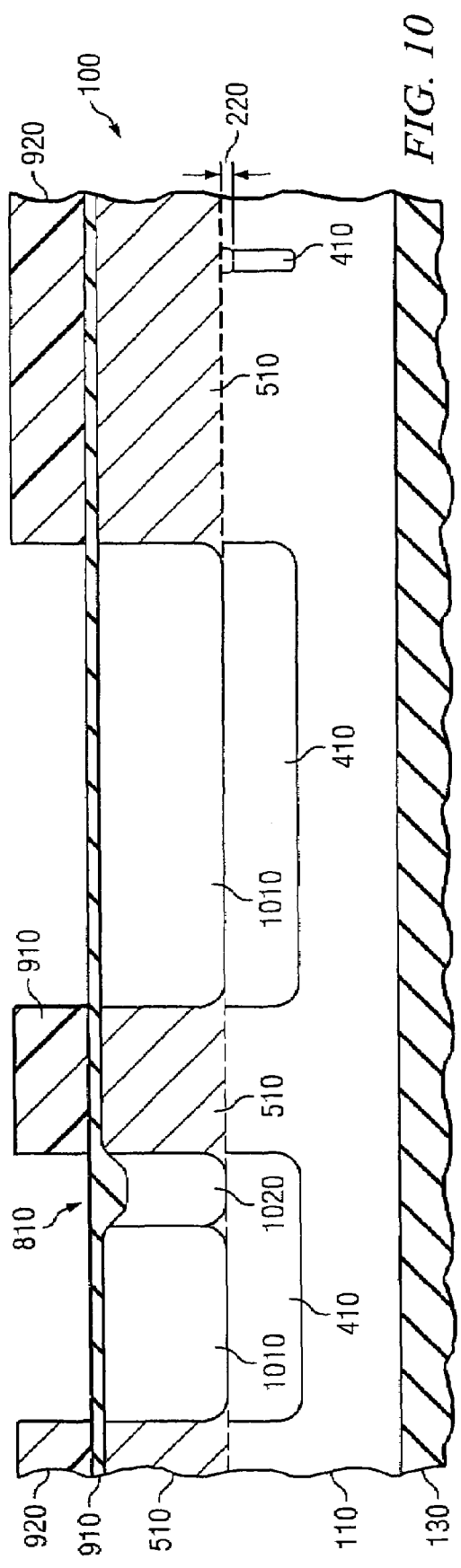

METHOD FOR MANUFACTURING A SEMICONDUCTOR DEVICE HAVING AN ALIGNMENT FEATURE FORMED USING AN N-TYPE DOPANT AND A WET OXIDATION PROCESS

TECHNICAL FIELD OF THE INVENTION

The present invention is directed, in general, to a method for manufacturing a semiconductor device and, more specifically, to a method for manufacturing a semiconductor device having an alignment feature formed using an n-type dopant and a wet oxidation process.

BACKGROUND OF THE INVENTION

The fabrication of integrated circuit (IC) devices on a semiconductor wafer involves a number of steps wherein patterns are transferred from photolithographic masks to the wafer. A masking step, for example, includes an etching step that defines selected areas to be exposed on the wafer for subsequent processes such as oxidation, metal deposition and impurity introduction. With IC device and feature sizes becoming increasingly smaller, it is important for a photolithographic mask to be aligned precisely with the wafer during the masking step in order to minimize any misalignment between the layers.

Most alignment schemes utilize alignment targets or marks that are defined on the wafer during a previous processing step. Typically, each alignment target includes topographical marks, which may be formed by etching a plurality of "steps" into the wafer. These steps may have, for example, a height of about 120 nm, with a width and spacing therebetween of about 10 µm. The alignment targets are used to diffract a laser alignment beam generated by a photolithography machine (commonly known as a wafer stepper) during the masking process. The wafer stepper receives the diffraction pattern, and the relative position of the wafer and the photolithographic mask are thereafter adjusted accordingly so that the pattern of the photolithographic mask is transferred to the wafer in the precise location as desired.

Unfortunately, traditional alignment marks are increasingly becoming problematic as the IC device and feature sizes continue to become progressively smaller. For example, a misalignment of 50 nm (i.e., 0.05 µm) in a 0.6 µm gate length process only represents an 8 percent misalignment of the gate, however, this same misalignment of 50 nm (i.e., 0.05 µm) represents a 28 percent misalignment for 0.18 µm gate length process gates. This larger percentage misalignment creates many issues in today's smaller gate length devices.

Additionally, traditional alignment marks are increasingly becoming problematic as system on chip (SOC) implementations gain acceptance and usage. Some of today's SOC implementations include 0.18 µm gate length devices, in combination with shallow trench isolation (STI) structures, flash memory, etc. The traditional alignment marks not only affect the smaller gate length devices, however, they also negatively affect the flash memory devices by causing bit-line stress. It is believed that the nonuniformity of the traditional alignment marks across the wafer causes a large disparity between STI structure step heights, which may be directly linked to the aforementioned bit-line stress and flash memory failure.

Accordingly, what is needed in the art is an alignment mark, and method of manufacture therefore, that does not experience the drawbacks that traditional alignment marks experience when used with today's ever changing integrated circuit devices.

SUMMARY OF THE INVENTION

To address the above-discussed deficiencies of the prior art, the present invention provides a method for manufacturing a semiconductor device having an alignment feature. The method for manufacturing the semiconductor device, among other steps, may include implanting an n-type dopant into a substrate thereby forming an implanted region and an unimplanted region in the substrate. The method may further include oxidizing the substrate using a wet oxidation process, the wet oxidation process and n-type dopant causing a ratio of oxidation of the implanted region to the unimplanted region to be 2:1 or greater, and then removing the oxidized portions of the substrate thereby leaving an alignment feature proximate the implanted region.

The foregoing has outlined preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention.

BRIEF DESCRIPTION OF THE DRAWINGS

The invention is best understood from the following detailed description when read with the accompanying FIGURES. It is emphasized that in accordance with the standard practice in the semiconductor industry, various features are not drawn to scale. In fact, the dimensions of the various features may be arbitrarily increased or reduced for clarity of discussion. Reference is now made to the following descriptions taken in conjunction with the accompanying drawings, in which:

FIG. 5 illustrates a cross-sectional view of the partially completed semiconductor device illustrated in FIG. 4 after forming an epitaxial layer over the substrate, and thereafter, forming an additional oxide layer and photoresist layer over the epitaxial layer;

FIG. 6 illustrates a cross-sectional view of the partially completed semiconductor device illustrated in FIG. 5 after initially implanting an n-type implant;

FIG. 7 illustrates a cross-sectional view of the partially completed semiconductor device illustrated in FIG. 6 after stripping the photoresist layer and subjecting the semiconductor device to an oxidation process;

FIG. 8 illustrates a cross-sectional view of the partially completed semiconductor device illustrated in FIG. 7 after stripping the oxide layer;

FIG. 9 illustrates a cross-sectional view of the partially completed semiconductor device illustrated in FIG. 8 after forming an oxide layer over the epitaxial layer and forming and patterning a photoresist layer over the oxide layer;

FIG. 10 illustrates a cross-sectional view of the partially completed semiconductor device illustrated in FIG. 9 after implanting a DNWELL implant within the epitaxial layer;

DETAILED DESCRIPTION

The present invention is based at least in part on the unique recognition that highly n-type doped substrates, for example silicon substrates, oxidize at a much faster rate than similar substrates having no n-type dopants therein or only small amounts of n-type dopants therein. For example, depending on the amount of n-type dopants within the substrate, the doped substrate oxidizes at a rate of about 2:1 or greater, when compared to an undoped substrate. In an exemplary embodiment, especially when using phosphorous as the dopant and a dose of about 1E15 atoms/cm$^2$ or greater, the doped substrate oxidizes at a rate of about 3:1 compared to an undoped substrate.

In view of this recognition, the present invention exclusively acknowledged that the n-type dopant could easily and inexpensively be used to precisely form alignment features. As will be discussed more fully with regard to FIGS. 1-12 below, the increased oxidation rate may be used to form a thicker oxide where the alignment features are desired, because of the presence of the n-type dopant, thereafter only to be removed, thus resulting in an advantageous alignment feature.

Figure 1:
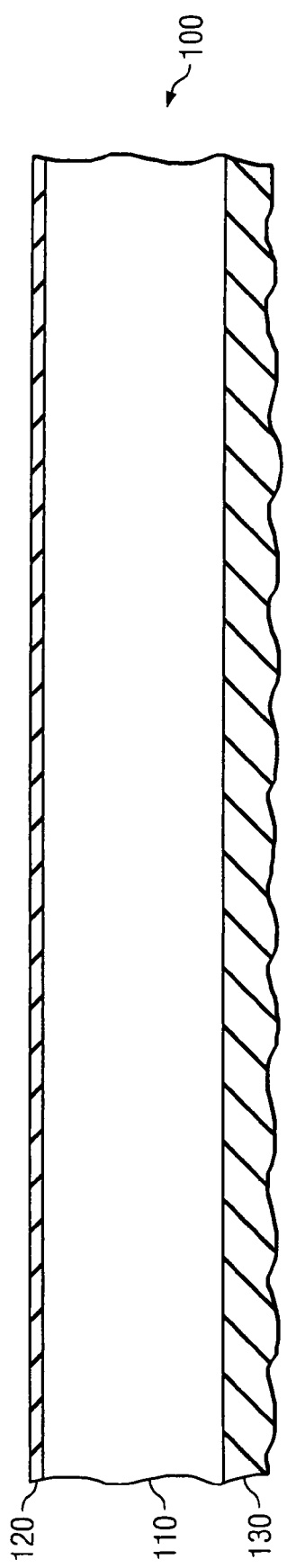
FIG. 1 illustrates a cross-sectional view of a partially completed semiconductor device manufactured in accordance with the principles of the present invention.

Turning now to FIGS. 1-12, illustrated are cross-sectional views of detailed manufacturing steps illustrating how one might manufacture a semiconductor device in accordance with the principles of the present invention. FIG. 1 illustrates a cross-sectional view of a partially completed semiconductor device 100 manufactured in accordance with the principles of the present invention. From the outset, it should be noted that the embodiments of FIGS. 1-12 will be discussed as a specific type of device, for instance a bipolar device, however, those skilled in the art appreciate that the claimed inventions of the present invention are equally applicable to other devices, apart from the bipolar device discussed. However, at least with regard to FIGS. 1-12, no other schemes will typically be discussed.

In the advantageous embodiment shown, the partially completed semiconductor device 100 of FIG. 1 includes a substrate 110. The substrate 110 may, in an exemplary embodiment, be any layer located in the partially completed semiconductor device 100, including a wafer itself or a layer located above the wafer (e.g., epitaxial layer). Nevertheless, in the embodiment illustrated in FIG. 1, the substrate 110 is a p-type on-axis epitaxial layer, having a thickness of about 20 μm and conductivity of about 7 ohm-cm.

Located over the substrate 110 on a front side thereof is an oxide layer 120, such as a screen or sacrificial oxide. The oxide layer 120, as one would expect, is configured to protect the substrate 110 from subsequent layers that might be formed thereon. In the embodiment shown, the oxide layer 120 has a thickness of about 140 nm and was formed using a 1000° C. steam oxidation for a time period of about 16 minutes. Other thicknesses and methods for forming the oxide layer 120 are within the scope of the present invention.

The partially completed semiconductor device 100 illustrated in FIG. 1 further includes a nitride layer 130 located on the backside thereof. While the nitride layer 130 may be formed using a number of different processes, the disclosed embodiment of FIG. 1 has the nitride layer 130 being deposited to a thickness of about 130 nm, and thereafter being etched back. Similarly, the nitride etch back results in about a 10 nm etchback of the oxide layer 120. Accordingly, the resulting nitride layer 130 is rather thin, and the resulting oxide layer is about 130 nm.

Figure 2:
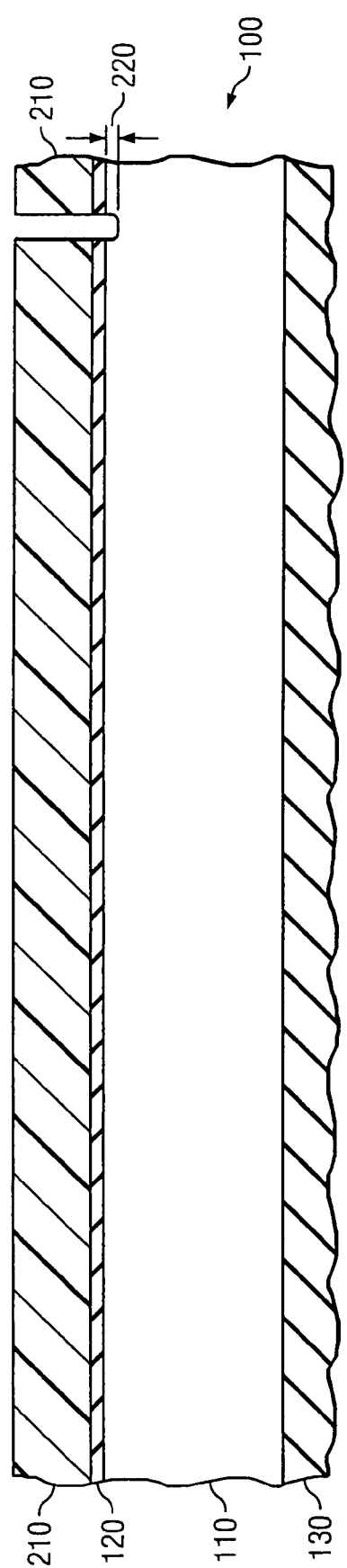
FIG. 2 illustrates a cross-sectional view of the partially completed semiconductor device illustrated in FIG. 1 after patterning a photoresist layer, and using the patterned photoresist layer to form an initial level alignment mark within the substrate.

Turning now to FIG. 2, illustrated is a cross-sectional view of the partially completed semiconductor device 100 illustrated in FIG. 1 after patterning a photoresist layer 210, and using the patterned photoresist layer 210 to form an initial level alignment mark 220 within the substrate 110. An exemplary lithographic process was used to form the initial level alignment mark 220 in the substrate 110. Lithography refers to a process for pattern transfer between various media. The lithographic process may include forming a radiation sensitive resist coating, such as the photoresist layer 210, over the layer to be patterned, in this case the oxide layer 120 and the substrate 110. The radiation sensitive resist coating may then be patterned by selectively exposing the resist through a mask. In turn, the exposed areas of the coating become either more or less soluble than the unexposed areas, depending on the type of resist. A solvent developer may then be used to remove the less soluble areas leaving the patterned photoresist layer 210. After the photoresist layer 210 is patterned, the oxide layer 120 and substrate 110 may be etched using the patterned resist layer as a mask to transfer the pattern to the oxide layer 120 and substrate 110. Etch processes, among others, might include plasma etching, reactive ion etching, wet etching, or combinations thereof.

What results, is the initial level alignment mark 220 extending into the substrate 110 a predetermined distance. For the purposes of the present invention, the initial level alignment mark 220 may extend into the substrate 110 a number of different distances. However, in the embodiment shown, the initial level alignment mark 220 extends into the substrate a distance of about 300 nm. As mentioned, other distances are within the scope of the present invention. After forming the initial level alignment mark 220, the oxide layer 120 and patterned photoresist layer 210 may be removed using conventional processes.

Figure 3:
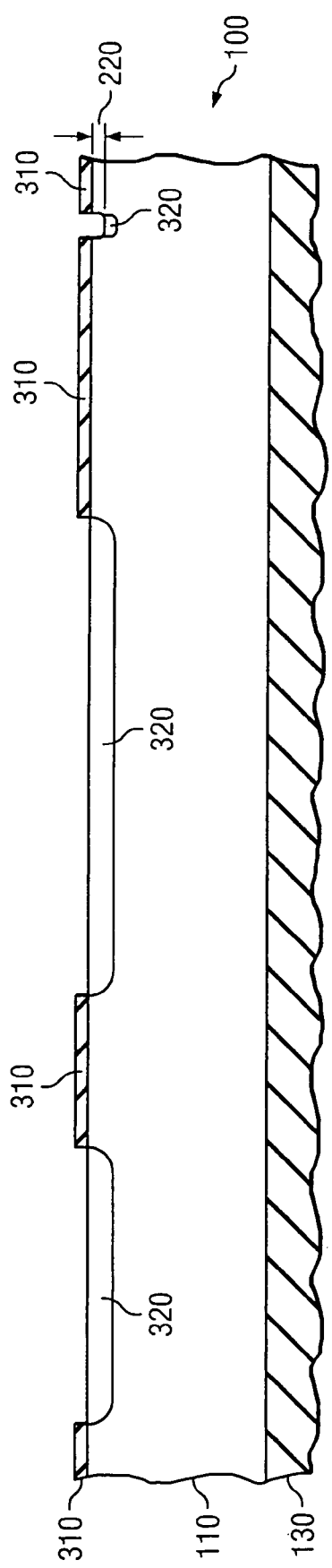
FIG. 3 illustrates a cross-sectional view of the partially completed semiconductor device illustrated in FIG. 2 after patterning an oxide layer on the substrate and forming n-type buried layer (NBL) implants in the substrate.

Turning now to FIG. 3, illustrated is a cross-sectional view of the partially completed semiconductor device 100 illustrated in FIG. 2 after patterning an oxide layer 310 on the substrate and forming n-type buried layer (NBL) implants 320 in the substrate 110. The oxide layer 310, in the particular embodiment shown, is a grown oxide having a thickness of about 130 nm. The thickness of the oxide layer 310 and method of manufacture therefore may be different from that disclosed without departing from the scope of the present invention. Those skilled in the art understand the process for patterning the oxide layer 310. For example, a process similar to the photolithographic process described above could be used. Additionally, the initial level alignment mark 220 is used as a reference to pattern the oxide layer 310.

The process for forming the NBL implants 320 is conventional, and thus a number of different processes may be used. In the embodiment of FIG. 3, however, the NBL implants 320 consist of antimony implanted using a dose of about 3.0E15 atoms/cm$^2$ and an energy of about 60KeV. As one would expect, these values may easily be tailored for other specific devices. After implanting the NBL implants 320, in an optional step, the oxide layer 310 may be partially stripped, thereby removing about 80 nm, and leaving about 50 nm of the oxide layer 310 remaining.

Figure 4:
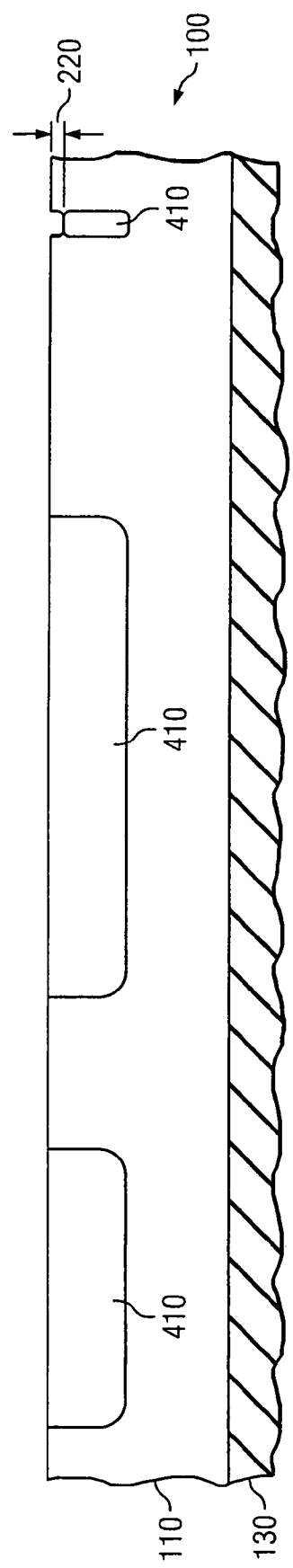
FIG. 4 illustrates a cross-sectional view of the partially completed semiconductor device illustrated in FIG. 3 after subjecting the NBL implants to a diffusion process, resulting in the completed NBL implants.

Turning now to FIG. 4, illustrated is a cross-sectional view of the partially completed semiconductor device 100 illustrated in FIG. 3 after subjecting the NBL implants 320 to a diffusion process, resulting in the completed NBL implants 410. The completed NBL implants 410 differ from the NBL implants 320 in that they extend further into the substrate 110. The NBL diffusion process is a conventional process, nevertheless, in the embodiment of FIG. 4, the NBL diffusion process is a multistep process occurring for about 7 hours in the presence of nitrogen and oxygen at different times and temperatures. After completing the NBL diffusion process, the oxide layer 310 and any additional oxide portions that may have grown, may then be stripped. Additionally, after stripping the oxide 310, a conventional cleaning process, such as a pre-epitaxial clean, may be performed on the substrate 110.

Turning now to FIG. 5, illustrated is a cross-sectional view of the partially completed semiconductor device 100 illustrated in FIG. 4 after forming an epitaxial layer 510 over the substrate 110, and thereafter, forming an additional oxide layer 520 and photoresist layer 530 over the epitaxial layer 510. The properties, including method of manufacture, thickness, conductivity, etc. of the epitaxial layer 510 will typically be tailored to the specific use of the semiconductor device 100. However, in the embodiment shown, the epitaxial layer 510 has a thickness of about 6.5 μm and a conductivity of about 7 ohm-cm.

The oxide layer 520 formed over the epitaxial layer 510, similar to previous oxide layers, is conventional. As with the previous oxide layers, the oxide layer 520 is configured to protect the epitaxial layer 510 from subsequent processes and layers that it may be subjected thereto. The oxide layer 520, in the embodiment shown, is a 30 nm oxide.

The photoresist layer 530 of FIG. 5 has a thickness of about 0.96 μm and is located directly on the oxide layer 520. As with previous photoresist layers, the photoresist layer 530 is patterning using conventional techniques. As will be detailed more below, the opening in the photoresist layer 530 is specifically positioned. As appreciated by those skilled in the art, the opening in the photoresist layer 530 is typically positioned using the initial level alignment mark 220.

Turning now to FIG. 6, illustrated is a cross-sectional view of the partially completed semiconductor device 100 illustrated in FIG. 5 after initially implanting an n-type implant 610. The n-type implant 610 may be formed using a number of different doses and energies while staying within the scope of the present invention. Nevertheless, it is believed that the implant dose of the n-type implant 610 should be about 1E15 atoms/cm$^2$ or greater. In an exemplary embodiment, the n-type implant 610 should be about 1E16 atoms/cm$^2$ or greater. Likewise, it is believed that the n-type implant 610 should be a rather higher energy implant. For example, it is believed that the n-type implant 610 could be implanted using sufficient energy such that the n-type atoms penetrate the epitaxial layer 510 surface. Accordingly, it is believed that the n-type implant 610 could be implanted using an energy of about 30 KeV or greater, and particularly about 130 KeV or greater.

The n-type dopant used to form the n-type implant 610 is also important to the scope of the present invention. For example, while phosphorous, arsenic, antimony, or any other known or hereafter discovered n-type dopant may be used, certain ones work better under certain conditions. As an example, phosphorous atoms are substantially smaller than both arsenic and antimony, and thus do not cause the lattice damage that arsenic and antimony cause during the implant process. For this reason, phosphorous is preferred in many instances. Nevertheless, all n-type dopants may be used and remain within the scope of the present invention.

Turning now to FIG. 7, illustrated is a cross-sectional view of the partially completed semiconductor device 100 illustrated in FIG. 6 after stripping the photoresist layer 530 and subjecting the semiconductor device 100 to an oxidation process. The stripping of the photoresist layer 530 is conventional, thus no further discussion will be given.

The aforementioned oxidation step causes an oxide layer 710 to be formed over the epitaxial layer 510. In the instance wherein the oxide layer 520 remains, such as shown, the oxide layer 710 continues its growth from the oxide layer 520. Unique to the present invention, the large amount of n-type dopant within the n-type implant 610 causes the oxide in that region to be thicker than the oxide that forms over portions of the epitaxial layer 510 that do not include the elevated amount of n-type dopant. For example, depending on the amount of n-type dopant within the epitaxial layer 510, that portion will oxidize at a ratio of about 2:1 or greater, when compared to the non n-type doped portions of the epitaxial layer 510. In an exemplary embodiment, the ratio is about 3:1 or greater.

The oxidation step used to form the oxide layer 710, and thus used to create the differential rate of oxidation between the n-type doped portions of the epitaxial layer 510 and the non n-type doped portions, may vary greatly. For example, in the embodiment shown, the oxidation step begins with a 30 minute wet oxidation followed by a 200 minute drive in the presence of nitrogen. The temperature of the oxidation process may vary greatly while remaining within the scope of the present invention. In an exemplary embodiment, however, the temperature of the oxidation process ranges from about 850° C. to about 1000° C., among other temperatures. As will be understood further below, the requisite oxide formation is related to the silicon step desired in the semiconductor device 100.

Turning now to FIG. 8, illustrated is a cross-sectional view of the partially completed semiconductor device 100 illustrated in FIG. 7 after stripping the oxide layer 710. Any conventional oxide etch or strip can be used to remove the oxide layer 710. What results, as a function of the increased oxidation rate of the n-type doped epitaxial layer 510 (e.g., the n-type implant 610), is an alignment feature 810. As briefly discussed above, the amount of n-type dopant within the epitaxial layer 510, as well as the specifics of the oxidation step forming the oxide layer 710, can be adjusted to precisely tailor the size, location and depth of the resulting alignment feature 810. In the given embodiment of FIG. 8, the alignment feature 810 has a depth (e.g., silicon step) of about 50 nm, however, those skilled in the art appreciate that this value may be tailored on a device-by-device basis.

Unique to the present invention, the alignment feature 810 has been formed without adding a single mask to the manufacturing process that would not have already been used. Also unique to the present invention, and mostly a function of the process for forming the alignment feature 810, the alignment feature 810 is substantially self-aligned to the n-type implant 610, and thus completed deep n-type implant 1020 (FIG. 10).

Turning now to FIG. 9, illustrated is a cross-sectional view of the partially completed semiconductor device 100 illustrated in FIG. 8 after forming an oxide layer 910 over the epitaxial layer 510 and forming and patterning a photoresist layer 920 over the oxide layer 910. The oxide layer 910 of FIG. 9 may again be formed using conventional processes and thicknesses. Nevertheless, the oxide layer 910 of FIG. 9 is about 20 nm thick.

The photoresist layer 920 of FIG. 9, however, is different than many of the previous photoresist layers formed in earlier steps in the manufacture of the semiconductor device 100. For example, where many of the previous photoresist layers were only about 0.96 μm thick, the photoresist layer 920 is much thicker. The photoresist layer 920 in the embodiment of FIG. 9 is about 5 μm thick or greater.

Advantageous for the present invention, the unique alignment feature 810 may be easily found and pinpointed so that the patterning of the photoresist layer 920 is accurate and misalignment easily discernable and measurable even through thick photoresist. As the patterning of the photoresist layer 920, as well as the features formed therefrom, depends on the location of the alignment feature 810, easily finding and accurately pinpointing the alignment feature 810 is critical.

Turning now to FIG. 10, illustrated is a cross-sectional view of the partially completed semiconductor device 100 illustrated in FIG. 9 after implanting a DNWELL implant 1010 within the epitaxial layer 510. The DNWELL implant 1010 may be formed using a number of different processes. One embodiment of the invention has the DNWELL implant 1010 being formed using a multi-implant step, wherein phosphorous is implanted using a dose of about 2E12 atoms/cm$^2$ at an energy of about 2 MeV, and arsenic is implanted using a dose of about 2.5E12 atoms/cm$^2$ at an energy of about 160 KeV. Other dopants, doses and energies are nonetheless within the scope of the present invention. The thick photoresist layer 910 is particularly useful for the high-energy implants used to form the DNWELL implants 1010.

During the formation of the DNWELL implant 1010, the partially completed semiconductor device 100 may be subjected to enough temperature to cause the n-type implant 610 to drive further into the epitaxial layer 510, resulting in the deep n-type implant 1020. In the embodiment shown in FIG. 10, the DNWELL implant 1010 and deep n-type implant 1020 extend to about the completed NBL implants 410. Other configuration may nonetheless exist. Further, the deep n-type implant 1020 may have a surface concentration less than about 1E19 atoms/cm$^3$, among others.

Figure 11:
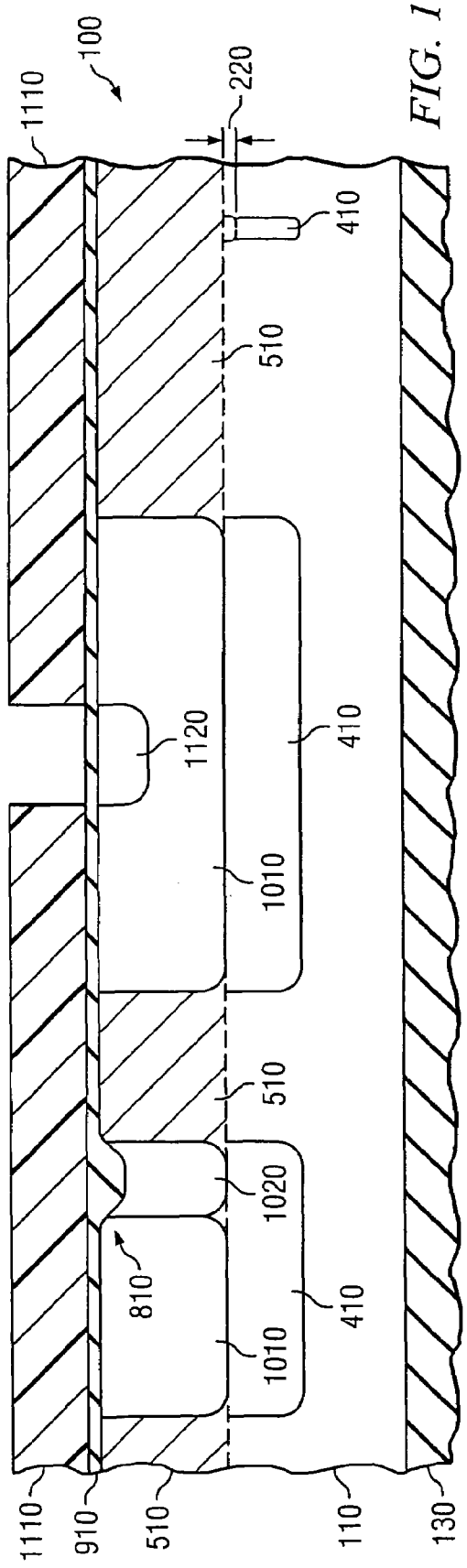
FIG. 11 illustrates a cross-sectional view of the partially completed semiconductor device illustrated in FIG. 10 after stripping the photoresist layer, and forming and patterning another photoresist layer over the epitaxial layer.

Turning now to FIG. 11, illustrated is a cross-sectional view of the partially completed semiconductor device 100 illustrated in FIG. 10 after stripping the photoresist layer 920, and forming and patterning another photoresist layer 1110 over the epitaxial layer 510. The stripping, forming and patterning of the photoresist layers is conventional, as previously discussed. It should be noted again that the alignment feature 810 is used to precisely position the openings in the photoresist layer 1110.

After patterning the photoresist layer 1110, a DWELL implant 1120 is formed therethrough. The DWELL implant 1120, similar to the DNWELL implants 1010, is a commonly used implant in semiconductor devices. The DWELL implant 1120, in the embodiment of FIG. 11, however, is again formed using a multi-step implant. The DWELL impant 1120 is formed using a first arsenic implant with a dose of about 7.5E13 atoms/cm$^2$ and an energy of about 160 KeV, a first boron implant with a dose of about 1.5E14 atoms/cm$^2$ and an energy of about 110 KeV and a second boron implant with a dose of about 2.0E13 atoms/cm$^2$ and an energy of about 375 KeV. Again, these are just examples for doses and energies that might be used to form the DWELL implant 1120.

Figure 12:
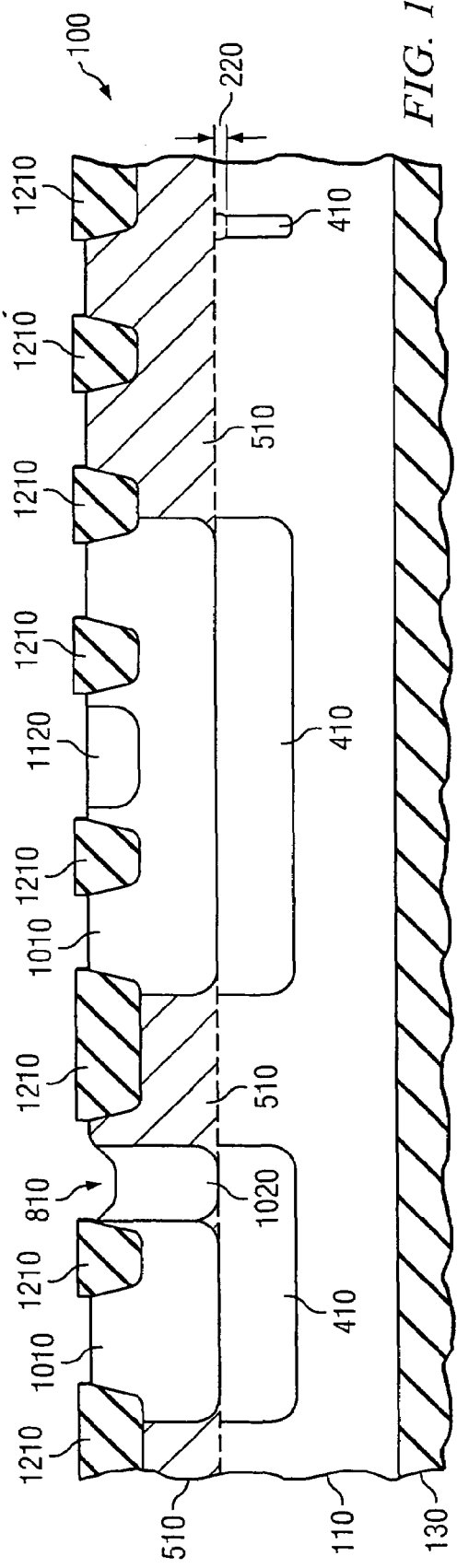
FIG. 12 illustrates a cross-sectional view of the partially completed semiconductor device illustrated in FIG. 11 after stripping the photoresist layer and conventionally forming shallow trench isolation (STI) structures along the epitaxial layer.

Turning now to FIG. 12, illustrated is a cross-sectional view of the partially completed semiconductor device 100 illustrated in FIG. 11 after stripping the photoresist layer 1110 and conventionally forming shallow trench isolation (STI) structures 1210 along the epitaxial layer 510. The placement of the STI structures 1210 are based on the alignment feature 810. As a result of the method for forming the alignment feature 810, the STI structures 1210 have a reduced step height. For example, in one embodiment the STI structures 1210 have a step height of about 60 nm or less. Advantageously, the STI structures 1210 may be formed without any additional masks or special moat processing steps. After completing the STI structures 1210, the process would continue in a conventional manner, ultimately resulting in operational semiconductor devices.

Although the present invention has been described in detail, those skilled in the art should understand that they can make various changes, substitutions and alterations herein without departing from the spirit and scope of the invention in its broadest form.

What is claimed is:

1. A method for manufacturing a semiconductor device having an alignment feature, comprising:
    implanting an n-type dopant into a substrate thereby forming an implanted region and an unimplanted region in the substrate;
    simultaneously oxidizing both the implanted and unimplanted regions of the substrate using a wet oxidation process, the wet oxidation process and n-type dopant causing a ratio of oxidation of the implanted region to the unimplanted region to be 2:1 or greater without forming a deep n-well at the implanted region; and
    removing the oxidized portions of the substrate thereby leaving an alignment feature superposing the implanted region, the alignment feature separate from a shallow trench isolation structure.

2. The method as recited in claim 1 wherein implanting an n-type dopant into a substrate thereby forming an implanted region includes implanting an n-type dopant using a dose of about 1E15 atoms/cm$^2$ or greater.

3. The method as recited in claim 2 wherein implanting an n-type dopant into a substrate using a dose of about 1E 15 atoms/cm$^2$ or greater includes implanting using an energy of about 30 KeV or greater.

4. The method as recited in claim 2 wherein the dose is about 1 E 16 atoms/cm$^2$ or greater.

5. The method as recited in claim 2 further including subjecting the implanted region to a drive step after oxidizing the substrate using the wet oxidation process, thereby forming a deep n-type well having a surface concentration less than about 1 E 19 atoms/cm$^3$.

6. The method as recited in claim 5 wherein the deep n-type well functions as a contact region for a collector portion of a bipolar transistor.

7. The method as recited in claim 5 further including forming trench isolation structures proximate the alignment feature, the trench isolation structures having a step height of about 60 nm or less.

8. The method as recited in claim 7 wherein forming trench isolation structures includes forming trench isolation structures without any additional masks or special moat processing steps.

9. The method as recited in claim 1 wherein oxidizing the substrate using a wet oxidation process includes oxidizing the substrate using a low temperature wet oxidation process using a temperature ranging from about 850° C. to about 1000° C.

10. The method as recited in claim 1 wherein removing the oxidized portions of the substrate thereby leaving an alignment feature proximate the implanted region includes leaving an alignment feature self-aligned to the implanted region.

11. The method as recited in claim 1 wherein the n-type dopant is phosphorous.

12. The method as recited in claim 11 wherein the ratio is about 3:1 or greater

13. The method as recited in claim 1 wherein the n-type dopant is selected from the group consisting of antimony and arsenic.

14. The method as recited in claim 1 wherein the substrate is epitaxial silicon.

15. The method as recited in claim 1 wherein the alignment feature has a depth of about 50 nm.

* * * * *